United States Patent [19]

Kosiorek

[11] 4,098,949
[45] Jul. 4, 1978

[54] METALLIZING COMPOSITIONS AND THE PREPARATION OF ELECTRICALLY CONDUCTIVE ARTICLES

[75] Inventor: Raymond Stanley Kosiorek, Houston, Pa.

[73] Assignee: Hercules Incorporated, Wilmington, Del.

[21] Appl. No.: 750,305

[22] Filed: Dec. 13, 1976

Related U.S. Application Data

[62] Division of Ser. No. 638,785, Dec. 8, 1975, Pat. No. 4,029,605.

[51] Int. Cl.² ............... B32B 15/04; H01B 1/08; B32B 17/06
[52] U.S. Cl. ............... 428/434; 252/514; 427/102; 427/103; 427/123; 427/125; 427/376 B; 427/405; 427/419 C; 427/108; 338/308; 29/620; 29/625; 428/209; 428/210; 428/426; 428/427; 428/428; 106/1.14

[58] Field of Search ............... 252/514; 106/1, 54; 428/434, 209, 210, 426, 427, 428; 427/102, 103, 108, 118, 269, 123, 125, 405, 376 B, 405, 419 B, 419 C; 29/620, 625; 338/308

[56] References Cited

U.S. PATENT DOCUMENTS

| | | | |
|---|---|---|---|
| 3,440,182 | 4/1969 | Hoffman | 106/1 |
| 3,463,647 | 8/1969 | Kosiorek | 106/54 |
| 3,493,404 | 2/1970 | Earl | 106/54 |
| 3,537,892 | 11/1970 | Milkovich | 428/434 |
| 3,615,734 | 10/1971 | Cole | 106/1 |

*Primary Examiner*—Ellis Robinson
*Attorney, Agent, or Firm*—Hazel L. Deming

[57] ABSTRACT

Metallizing compositions suitable for the production of fired on electrically conductive films which do not adversely affect the overall strength of heat resistant substrates are described. The compositions comprise, in specified proportions, at least one finely divided electrically conductive metal, certain alkali metal, crystallizable, high silica glass frits as binder, inert liquid vehicle and, if desired, inert filler and/or pigment. The compositions are particularly suited to glass substrates and provide therewith composite structures having greater strength than that of the glass substrate.

7 Claims, No Drawings

METALLIZING COMPOSITIONS AND THE PREPARATION OF ELECTRICALLY CONDUCTIVE ARTICLES

This is a division of application Ser. No. 638,785, filed Dec. 8, 1975 now U.S. Pat. No. 4,029,605.

This invention relates to metallizing compositions containing an electrically conductive metal and a crystallizable frit, to a method for applying these compositions to heat resistant substrates and particularly glass and other ceramic substrates, and to articles of heat resistant substrates having an electrically conductive metal film fused to at least a portion of their surfaces.

Metallizing compositions and particularly paste-like or liquid metallizing compositions containing finely-divided silver particles and an inorganic binder dispersed in a liquid vehicle are known to the art. In such compositions the inorganic binder component serves to bond the conductive silver firmly to the substrate to which the composition is applied and the liquid vehicle is present to form a metallizing ink, paint or paste for ease of application to the substrate in a desired pattern.

The conventional inorganic binders for metallizing compositions which provide fired-on conductive metal coatings on ceramic substrates are frits of soft glasses such as, for example, the metal borate glasses, the borosilicate glasses containing at least as much boron as silica, the borosilicate high density glasses containing high amounts of bismuth and/or lead oxides, the high barium and/or strontium oxide-containing glasses, and the like. Frits of the above types in which silica is the minor glass-forming ingredient give metallizing compositions of good adhesion and solder acceptability. However, because the metallizing compositions have high coefficients of thermal expansion ranging usually from about +155 to +180 × $10^{-7}$/° C., they are not suitable for use with many substrates and particularly with the low expansion glass-ceramics or thin flint glass substrate due to their weakening effect on the substrate. The designing of satisfactory metallizing coating compositions which will provide good substrate wetting as well as coefficients of expansion equal to or below that of the substrate so that weakening does not occur has not been achieved. Thus, the search continues for metallizing compositions having a broader range of utility and better characteristics than those presently known.

Now, in accordance with the present invention, it has been found that metallizing compositions formulated with certain alkali metal, crystallizable high silica frits not only produce on firing a conductive metal coating having good adherence to a wide variety of substrates but that the resulting composite structure has a greater strength value than that of the non-coated substrate to which the coating is applied. The finding that any improvement of strength can be realized with the metallizing compositions of this invention is indeed surprising because it has generally been recognized in the ceramic art that weakening, not strengthening, results when a substrate is fusion coated with a material having a significantly higher coefficient of expansion.

Accordingly, the present invention relates to a conductive metal composition adapted to be applied to and fired on a heat resistant substrate to form thereon an electrically conductive, adherent film which does not adversely affect the overall strength of the substrate, said composition comprising, by weight, (a) from 50 to 88% of at least one finely-divided, electrically conductive metal; (b) from 2 to 40% of a crystallizable glass frit binder comprising by weight 40 to 70% of $SiO_2$, 10 to 31% of $Al_2O_3$, 3 to 20% of $Li_2O$, 2 to 15% of $B_2O_3$, 0 to 4% of $As_2O_3$, 0 to 5% of $Na_2O$, 0 to 5% of $K_2O$, 0 to 6% of $Bi_2O_3$, and at least one oxide component selected from the group consisting of 4 to 19% of $ZrO_2$ and 1 to 10% of $TiO_2$; (c) from 5 to 48% of an inert liquid vehicle; and (d) from 0 to 20% of an inert filler or pigment. The invention also relates to a method for forming an electrically conductive film on a heat resistant substrate using the composition of this invention and to the articles so formed.

The crystallizable glass frits which serve as the binder component in the conductive metal compositions of this invention are, as indicated, high silica glasses comprising as base constituents on the oxide basis

|  | Range (%) | Preferred Range (%) |
|---|---|---|
| $SiO_2$ | 40–70 | 45–65 |
| $Al_2O_3$ | 10–31 | 10–20 |
| $Li_2O$ | 3–20 | 5–10 |
| $B_2O_3$ | 2–15 | 5–15 |
| $ZrO_2$ | 4–19 | 10–15 |
| $TiO_2$ | 1–10 | 2–6 |
| $As_2O_3$ | 0–4 | 0–4 |
| $Na_2O$ | 0–5 | 0–5 |
| $K_2O$ | 0–5 | 0–5 |
| $Bi_2O_3$ | 0–6 | 2–5 | at least one of $ZrO_2$ or $TiO_2$ being present in the above amount as a nucleating agent. The frits will usually also contain at least one of $As_2O_3$, $Na_2O$, $K_2O$ or $Bi_2O_3$ as refining agents or modifiers, in which case the total amount of such agents or modifiers will preferably range from about 1 to about 10%.

The following frit compositions are given as examples of preferred compositions which will crystallize β-spodumene or β-eucryptite when fired under appropriate conditions. All thermal expansion values reported in the Table and the examples which follow were measured according to ASTM E-228-71.

Table I

| Frit Constituents | A Wt. | A % Oxide | B Wt. | B % Oxide | C Wt. | C % Oxide | D Wt. | D % Oxide | E Wt. | E % Oxide | F Wt. | F % Oxide |
|---|---|---|---|---|---|---|---|---|---|---|---|---|
| $SiO_2$ | 600 | 47.5 | 600 | 49.1 | 600 | 49.6 | 606 | 48.4 | 450 | 60.4 | 425 | 59.2 |
| $Al_2O_3$ | 230 | 18.2 | 190 | 15.6 | 190 | 15.7 | 190 | 15.2 | 110 | 14.8 | 80 | 11.2 |
| $Li_2CO_3$[(1)] | 520 | 16.8 | 520 | 17.3 | 490 | 16.6 | 490 | 16.0 | 112 | 6.1 | 140 | 7.8 |
| $TiO_2$ | — | — | — | — | — | — | — | — | 30 | 4.0 | 30 | 4.2 |
| $ZrO_2$ | 160 | 12.7 | 160 | 13.1 | 160 | 13.2 | 160 | 12.8 | — | — | — | — |
| $As_2O_3$ | 15 | 1.2 | 15 | 1.2 | 15 | 1.2 | 15 | 1.2 | — | — | — | — |
| $H_3BO_3$[(2)] | 80 | 3.6 | 80 | 3.7 | 80 | 3.7 | 80 | 3.6 | 150 | 11.4 | 170 | 13.4 |
| $Na_2CO_3$[(3)] | — | — | — | — | — | — | 60 | 2.8 | — | — | — | — |
| $Bi_2O_3$ | — | — | — | — | — | — | — | — | 25 | 3.3 | 30 | 4.2 |
| Coefficient of Thermal Expan- | | | | | | | | | | | | |

Table I-continued

| Frit Constituents | A Wt. | A % Oxide | B Wt. | B % Oxide | C Wt. | C % Oxide | D Wt. | D % Oxide | E Wt. | E % Oxide | F Wt. | F % Oxide |
|---|---|---|---|---|---|---|---|---|---|---|---|---|
| sion (° C. $\times 10^{-7}$) | −50 | | −11 | | −30 | | −3 | | +13 | | +20 | |

[1] Oxide component $Li_2O$
[2] Oxide component $B_2O_3$
[3] Oxide component $Na_2O$ Typically, the crystallizable frits are made by mixing the batch components together, melting or smelting the mixture, pouring the melt into water to produce a frit and then grinding the resulting frit, usually with a ball mill to provide a frit composition which will pass a 325-mesh screen.

The frit may include minor amounts of impurities or optional constituents other than those noted above, provided, of course, that the inclusion of such constituents or the amount utilized does not detract from the advantages of the invention.

The composition of the invention, as indicated, contains a major amount which is from 50 to 88% by weight of the composition of at least one electrically conductive metal such as the noble metals, gold, silver, platinum, palladium, rhodium and iridium in particulate form. Silver is the preferred noble metal and most preferably will be present in an amount from 60 to 86% by weight of the composition. The particulate metal is generally present in its elemental form and the particles thereof are usually in powder or flake form. Preferably, the metal is a powder which will pass through a 200 mesh or smaller screen. Particulate compounds of the metal can also be used provided the compound can be reduced to the elemental metal during processing such as by carrying out the firing in the presence of a reducing atmosphere.

The liquid vehicle portion of the composition functions to hold the conductive metal particles and the frit binder together and to permit the facile application of the composition to the substrate. The liquid should be inert to the other components of the composition and to the substrate to which it is applied and should not interfere with the formation of a metallic film during firing. Many liquids satisfy these general requirements and are known to perform well in metallizing compositions. Particularly suitable are pine oil, turpentine, mineral oils, glycols, clean burning heavy bodied oils and the like. The method of application and the thickness of the desired coating will, of course, influence the proportion and type of liquid vehicle in the composition.

The metallizing composition can also contain, if desired, a small amount and preferably up to 20% by weight of the composition of inert fillers and/or pigments. The inclusion of fillers such as silica or alumina usually results in films having improved abrasion durability. Although the inclusion of pigments is generally for the purpose of enhancing the coloration of the substrate, certain pigments can also function as fillers and in this dual capacity can be used to impart color to the composite structure and to modify the properties of the coating in a desired manner.

The compositions of the invention can be applied to any substrate which retains its integrity during the firing operation such as ferrous and non-ferrous metal substrates and ceramic substrates but is particularly suited to the ceramic substrates such as glass, china, porcelain and glass-ceramics. The method of application of the composition to the substrate is conventional and typically includes such well known techniques as spraying, brushing, dipping, banding or screen or stencil printing.

Following application of the composition to the substrate in the desired pattern or design, the coating is preferably, but not necessarily, dried prior to firing. Air drying will usually suffice when the vehicle is volatile at room temperature. Under other circumstances, dry air currents or mild baking at elevated temperature may be required to remove the diluent. The temperature of actual firing will vary, depending upon the maturation temperature of the frit but should be below the point at which the substrate will physically deform or change chemically. Usually, firing at a temperature of at least about 590° C. and which is within the tempering cycle of the substrate will fuse the frit and effect a firm bond between the composition and the substrate. Preferably, firing is carried out for 2 to 15 minutes at from about 600 to about 900° C.

The compositions of the invention are particularly useful in the production of electrical components since the fired on metallic films, in an electrical pattern or design on ceramic objects, are easily connected in electrical circuits. Among the many uses are conductors, resistors and other components in printed circuits and other electronic applications, capacitors, glass electrodes, electroconducive heating elements on aircraft, architectural and automobile windows to remove moisture or ice deposits, ornamental metallic coatings or designs, and the like.

The invention is further described by reference to the following examples wherein all parts and percentages are by weight unless otherwise indicated.

EXAMPLES 1 to 5

Various silver metallizing pastes were prepared by blending 236 parts of particulate silver as powder or flake, from 23.6 to 28 parts of a crystallizable frit or frit mixture, and 41 parts of a pine oil vehicle and subjecting the blends to the shearing action of a three-roll mill. The resulting silver pastes were screen printed in an electrical grid pattern on ¼ inch float glass plates and in an overall wraparound design on ¼ inch flint glass rods, and the printed plates and rods were dried at 425° C. for 10 minutes and then fired at 621° C. for 7 minutes. A control paste was also prepared in the manner of Example 2 except that the 22.4 parts of Frit F were replaced with 22.4 parts of the control frit and 44.7 parts of the vehicle were used. Details of the paste compositions of these examples and the control and the properties of the printed glass articles are given below in Table II.

Table II

| | Ex. 1 | Ex. 2 | Ex. 3 | Ex. 4 | Ex. 5 | Control |
|---|---|---|---|---|---|---|
| Paste Composition (parts by weight) | | | | | | |

Table II-continued

|  | Ex. 1 | Ex. 2 | Ex. 3 | Ex. 4 | Ex. 5 | Control |
|---|---|---|---|---|---|---|
| Silver flake | — | — | 118 | 236 | — | — |
| Silver powder | 236 | 236 | 118 | — | 236 | 236 |
| Frit E of Table I | — | — | — | — | 28 | — |
| Frit F of Table I | 28 | 22.4 | 28 | 28 | — | — |
| Control frit[1] | — | 1.2 | — | — | — | 23.6 |
| Pine oil vehicle | 41 | 41 | 41 | 41 | 41 | 44.7 |
| Coefficient of thermal expansion (° C. × $10^{-7}$) | +135 | +149 | — | — | +129 | +172 |
| Modulus of Rupture (p.s.i.)[2] | 18,701 | 16,949 | 14,130 | 14,013 | 20,515 | 9,020 |
| Electrical resistance (Ω/in)[3] | 0.31 | 0.26 | 0.31 | 0.29 | 0.21 | 0.14 |

[1]Frit of a conventional high density lead borosilicate glass containing 66.6% PbO, 22.4% of $SiO_2$, 8.5% $B_2O_3$ and 2.5% $Al_2O_3$ and having a coefficient of thermal expansion of 75 × $10^{-7}$/° C.
[2]Determined on the glass rods; modulus of rupture of non-printed glass rods was 15,129 p.s.i.
[3]Determined on the glass plates.

EXAMPLES 6-9

The procedure of Example 5 was repeated except that in these examples an equal amount of frit A (Example 6), frit B (Example 7), frit C (Example 8) and frit D (Example 9) was substituted for frit E. The modulus of ruptures values for the fired flint glass rods printed with the pastes of these examples ranged from 17,000 to 20,000 p.s.i. and the electrical resistance values ranged from 0.26 to 0.36 Ω/inch.

If desired, the strength of ceramic substrates and particularly glass metallized with the compositions of this invention can be further increased by staining that area of the substrate to which the conductive metal composition is to be applied. Stains are well known and commercially available and typically comprise a silver compound such as silver chloride, a modifier such as one or more compounds of iron or copper, inert filler ingredients, and an inert liquid vehicle. The stain is applied to the substrate conventionally as by screen printing and then the stained substrate, with or without drying, is fired to the maturation temperature which usually ranges from about 510° to about 540° C., depending upon the particular stain employed. after removal of any residue from the firing step, the stained substrate is next overprinted in the area of stain with the conductive paste and then fired as above. This results in a metallized substrate having outstanding strength properties. It is also possible to incorporate the stain ingredients directly with the paste constituents and arrive at metallized substrates of improved strength. The use of a stain in combination with the paste of Example 5 is demonstrated below.

EXAMPLES 10-12

Flint glass rods having a diameter of 0.25 inch and a length of 3 inches were printed with a stain composed of, by weight, 9.25 of silver chloride, 15.2% of ferrous sulfide, 15.2% of cuprous sulfide, 38.4% of silica and 22% of pine oil vehicle by screen printing and the printed rods were dried at 425° C. for 10 minutes and then fired at 510° C. for 10 minutes. The resulting stained rods were next overprinted in the area of the stain with the paste of Example 5 and the overprinted rods were dried at 425° C. for 10 minutes and then fired at 620° C. for 7 minutes. For the sake of comparison, a flint glass rod was also treated in the manner of these examples except that no stain was used and the paste was printed directly onto the glass rod after firing the rod at 510° C. for 10 minutes. The strength values for the metallized rods and a glass rod control fired at the same temperature-time cycles as above except no stain or paste was used are reported below.

| Example No. | Stain | Modulus of Rupture (p.s.i.) |
|---|---|---|
| 10 | light | 20,129 |
| 11 | dark | 22,743 |
| 12 | none | 19,872 |
| glass rod control | none | 15,215 |

What I claim and desire to protect by Letters Patent is:

1. An article comprising a heat resistant substrate having fused to at least a portion of its surface an electrically conductive metal film which does not adversely affect the overall strength of the substrate and is derived from a composition comprising by weight
   (a) from 50 to 88% of at least one finely-divided electrically conductive metal;
   (b) from 2 to 40% of a crystallizable glass frit binder consisting essentially of by weight 40 to 70% of $SiO_2$, 10 to 31% of $Al_2O_3$, 3 to 20% of $Li_2O$, 2 to 15% of $B_2O_3$, 0 to 4% of $As_2O_3$, 0 to 5% of $Na_2O$, 0 to 5% of $K_2O$, 0 to 6% of $Bi_2O_3$, and at least one oxide component selected from the group consisting of 4 to 19% of $ZrO_2$ and 1 to 10% of $TiO_2$;
   (c) from 5 to 48% of an inert liquid vehicle; and
   (d) from 0 to 20% of an inert filler or pigment.

2. The article of claim 1 wherein the electrically conductive metal is silver and the substrate is glass.

3. The article of claim 2 wherein said portion of the surface of the glass substrate to which the metal film is fused is silver stained.

4. A method for forming on a heat resistant substrate an electrically conductive metal film which does not adversely affect the overall strength of the substrate, which method comprises applying to at least a portion of the surface of said substrate a layer of a conductive metal composition comprising by weight
   (a) from 50 to 88% of at least one finely-divided electrically conductive metal;
   (b) from 2 to 40% of a crystallizable glass frit binder consisting essentially of by weight 40 to 70% of $SiO_2$, 10 to 31% of $Al_2O_3$, 3 to 20% of $Li_2O$, 2 to 15% of $B_2O_3$, 0 to 4% of $As_2O_3$, 0 to 5% of $Na_2O$, 0 to 5% of $K_2O$, 0 to 6% of $Bi_2O_3$, and at least one oxide component selected from the group consisting of 4 to 19% of $ZrO_2$ and 1 to 10% of $TiO_2$;
   (c) from 5 to 48% of an inert liquid vehicle; and
   (d) from 0 to 20% of an inert filler or pigment;
and firing said layer on the substrate to form an adherent film of the electrically conductive metal thereon.

5. The method of claim 4 wherein the substrate is a ceramic substrate and the electrically conductive metal is silver.

6. The method of claim 5 wherein said portion of the surface of the substrate to which the composition is applied is pretreated by applying a silver stain thereto and firing said stain on the substrate.

7. The method of claim 6 wherein the ceramic substrate is glass.

* * * * *